(12) United States Patent
Selvanayagam

(10) Patent No.: US 12,362,536 B2
(45) Date of Patent: Jul. 15, 2025

(54) DRIVER CIRCUIT AND METHOD FOR CONTROLLING A LIGHT SOURCE

(71) Applicant: Analog Devices International Unlimited Company, Limerick (IE)

(72) Inventor: Sivanendra Selvanayagam, Abingdon (GB)

(73) Assignee: Analog Devices International Unlimited Company, Limerick (IE)

( * ) Notice: Subject to any disclaimer, the term of this patent is extended or adjusted under 35 U.S.C. 154(b) by 524 days.

(21) Appl. No.: 16/869,154

(22) Filed: May 7, 2020

(65) Prior Publication Data

US 2021/0351566 A1 Nov. 11, 2021

(51) Int. Cl.
*H01S 5/042* (2006.01)
*H01S 5/026* (2006.01)

(52) U.S. Cl.
CPC .......... *H01S 5/0428* (2013.01); *H01S 5/0261* (2013.01)

(58) Field of Classification Search
None
See application file for complete search history.

(56) References Cited

U.S. PATENT DOCUMENTS

| | | | | |
|---|---|---|---|---|
| 3,944,854 A * | 3/1976 | Keller | ..................... | H05B 45/10 250/552 |
| 5,444,728 A * | 8/1995 | Thompson | .............. | H01S 5/042 372/38.07 |
| 5,736,881 A * | 4/1998 | Ortiz | .................. | H05B 45/3725 327/515 |
| 6,826,215 B2 * | 11/2004 | Tsuji | ....................... | H01S 5/042 372/38.03 |
| 8,129,916 B2 | 3/2012 | Godbole | | |
| 8,203,283 B2 | 6/2012 | Hoogzaad | | |
| 9,054,485 B1 * | 6/2015 | Ng | ........................ | H01S 5/0427 |
| 10,158,211 B2 | 12/2018 | Barnes et al. | | |
| 11,245,247 B2 * | 2/2022 | Colles | .................... | H01S 5/0261 |
| 2003/0016711 A1 * | 1/2003 | Crawford | ................ | H01S 5/042 372/38.02 |
| 2010/0283322 A1 * | 11/2010 | Wibben | ................ | H02M 3/158 307/31 |
| 2014/0211192 A1 * | 7/2014 | Grootjans | ............... | H02M 7/42 356/5.01 |

(Continued)

FOREIGN PATENT DOCUMENTS

| | | | | |
|---|---|---|---|---|
| EP | 3907837 A1 * | 11/2021 | ............. | H01S 5/042 |
| JP | 3893655 B2 * | 3/2007 | | |

(Continued)

OTHER PUBLICATIONS

"European Application Serial No. 21164984.3, Extended European Search Report mailed Sep. 16, 2021", 7 pgs.

(Continued)

*Primary Examiner* — Tod T Van Roy
(74) *Attorney, Agent, or Firm* — Schwegman Lundberg & Woessner, P.A.

(57) ABSTRACT

The present disclosure relates to a driver circuit for a light source and related methods of operating the driver circuit. In particular, it relates to a driver circuit designed to reduce the effect of parasitic inductances on the rise time/fall time of excitation current pulses applied to the light source using the driver circuit.

18 Claims, 15 Drawing Sheets

(56) References Cited

U.S. PATENT DOCUMENTS

| | | | | |
|---|---|---|---|---|
| 2014/0300952 | A1* | 10/2014 | Gusev | H01S 5/06216 |
| | | | | 359/333 |
| 2016/0191196 | A1* | 6/2016 | Troiani | H04Q 11/0066 |
| | | | | 398/52 |
| 2017/0070029 | A1* | 3/2017 | Moeneclaey | H01S 5/183 |
| 2017/0085057 | A1* | 3/2017 | Barnes | H01S 5/0428 |
| 2019/0229493 | A1* | 7/2019 | Stern | H01S 5/0428 |
| 2019/0386460 | A1* | 12/2019 | Barnes | H01S 3/10 |
| 2020/0067269 | A1* | 2/2020 | Eggermont | H01S 5/423 |
| 2021/0104866 | A1* | 4/2021 | Avci | H03K 17/164 |
| 2021/0351566 | A1* | 11/2021 | Selvanayagam | H01S 5/042 |
| 2022/0013981 | A1* | 1/2022 | Kamizuru | H01S 5/0428 |

FOREIGN PATENT DOCUMENTS

| | | | |
|---|---|---|---|
| JP | 3899573 B2 * | 3/2007 | |
| WO | 2019167039 | 9/2019 | |

OTHER PUBLICATIONS

"European Application Serial No. 21164984.3, Communication Pursuant to Article 94(3) EPC mailed Aug. 18, 2023", 4 pgs.

\* cited by examiner

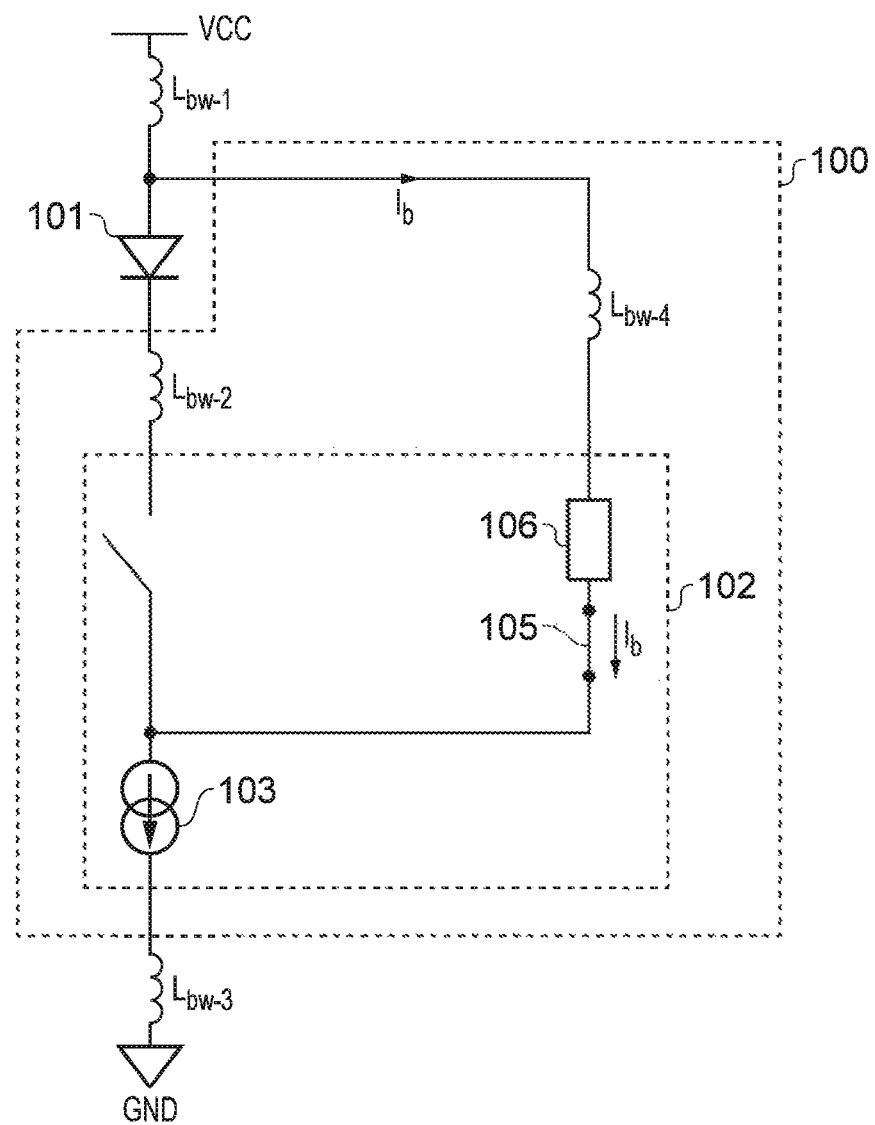
FIG. 2c(ii)

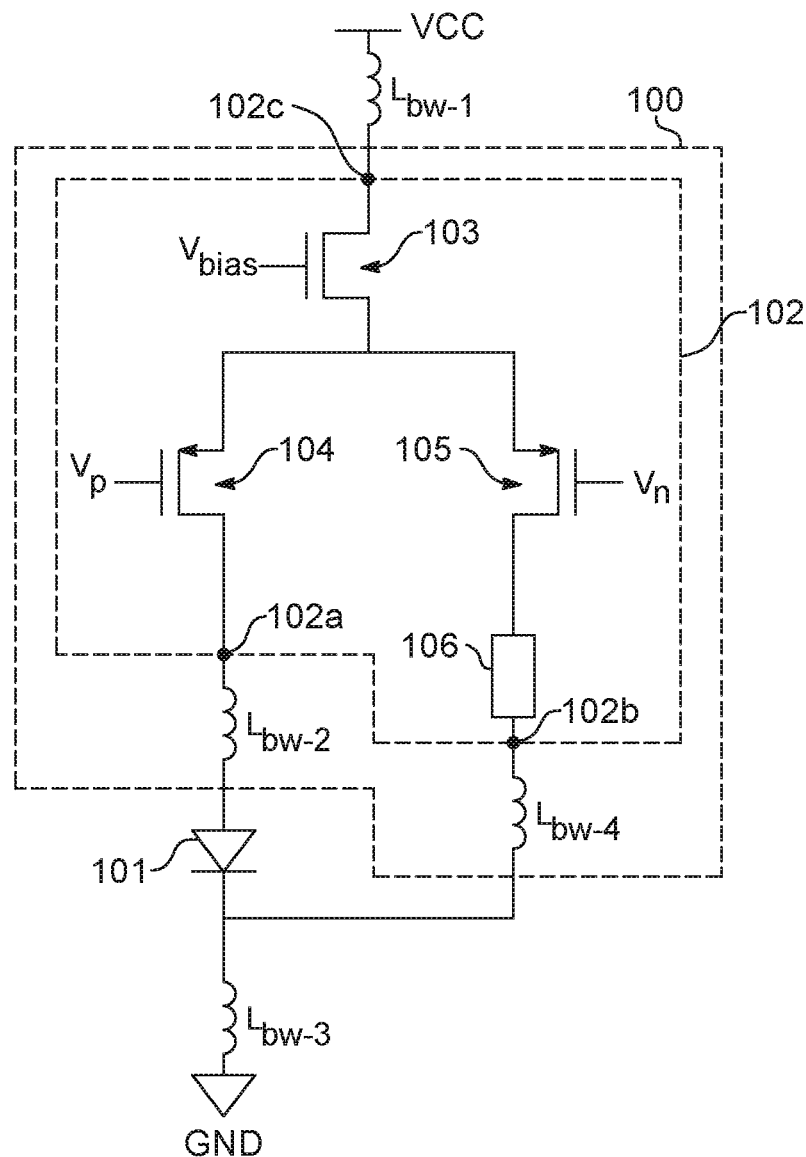
FIG. 6c(ii)

DRIVER CIRCUIT AND METHOD FOR CONTROLLING A LIGHT SOURCE

FIELD OF DISCLOSURE

The present disclosure relates to a driver circuit for a light source and related methods of operating the driver circuit. In particular, it relates to a driver circuit designed to reduce the effect of parasitic inductances on the rise time/fall time of excitation current applied to the light source using the driver circuit.

BACKGROUND

Time-of-flight (ToF) camera systems are three-dimensional, range imaging systems that resolve the distance between the camera and an object by measuring the round trip time of a light signal emitted from the ToF camera system. ToF systems have applications in the mobile, automotive and factory automation domains. The three-dimensional depth sensing technology of a ToF system relies on a light source illuminating a given object with multiple precisely timed bursts of light. The systems typically comprise a light source (such as a laser or LED), a light source driver to control the emission of light from the light source, an image sensor to image light reflected by the subject, an image sensor driver to control the operation of the image sensor, optics to shape the light emitted from the light source and to focus light reflected by the object onto the image sensor, and a computation unit configured to determine the distance to the object by determining the amount of time between an emission of light from the light source and a corresponding reflection from the object.

SUMMARY OF DISCLOSURE

In ToF systems, a vertical cavity surface emitting laser (VCSEL) is commonly used as the light source with a driver circuit supplying current pulses to excite the laser. Some requirements for ToF systems suitable for portable applications may include a large depth sensing range and high measurement accuracy. In order to achieve a large depth sensing range a driver circuit for the ToF system can be designed to generate current pulses with high peak power, typically 3-4 A. The frequency range for operation of the driver circuit and the rise/fall time of excitation current pulses applied to the light source by the driver circuit may affect the measurement accuracy of the ToF system. It may desirable to have a high frequency range for pulsing the light source, for example, 300 MHz and a short rise/fall time for the excitation current pulses, for example less than 1ns, for a high measurement accuracy. It may be additionally desirable in some portable applications to reduce the power consumption of the driver circuit in the ToF system, for example, to improve the battery life of the device comprising the ToF system.

The present disclosure relates to a driver circuit for a light source and related methods of operating the driver circuit. In particular, it relates to a driver circuit designed to reduce the effect of parasitic inductances on the rise time/fall time of excitation current pulses applied to the light source using the driver circuit.

The proposed driver circuit of the present invention has an advantage that it can be used to improve the rise and/or fall times of excitation current pulses applied to a light source by reducing the undesirable effect of parasitic inductances on the rise and fall times. The inventors have considered the parasitic inductances present in a conventional circuit and have proposed a design of a driver circuit which effectively minimises the contribution of each of these inductances to the total inductance or loop inductance of the driver circuit. This in turn, may result in the rise time of an excitation current pulse applied to the light source driven by the driver circuit, to be reduced while also enabling the circuit to be operated at relatively low supply voltages, for example, at voltages as low as 3-5V, which may be beneficial for ToF applications.

The proposed driver circuit implements a current control circuit that comprises a drive path, a bypass path and a current source, the current source being common to the drive path and the bypass path. In this circuit, to turn the light source off, the driver circuit may direct current to flow from a first potential to a second potential, via the bypass path and the current source of the current control unit. To turn the light source on, the driver circuit may direct current to flow from the first potential to the second potential via the drive path and the current source of the current control unit. The design of the driver circuit ensures a substantially constant current flow through at least some of the parasitic inductances. As a result, the effective total parasitic inductance or loop inductance is reduced, resulting in faster rise and fall times for the excitation current pulses. The reduced rise and fall time may enable the driver circuit to operate at a higher, improved frequency, when compared to conventional circuits. In ToF applications, for example, such a driver circuit may enable improved depth resolution.

An additional advantage of one of the proposed implementations of the driver circuit of the present invention is a built-in programmability for supplying a desired pre-drive current and a desired drive current. This may enable efficient use of the die-area of the driver circuit for modulation of drive and pre-drive currents. Furthermore, it may increase the flexibility of the driver circuit to be used with different types of light source and/or for different applications, each of which may have different pre drive current and/or drive current requirements. As will be described in detail in the description below, the built-in programmability is achieved by implementing multiple current control unit in a parallel configuration in the driver circuit.

According to a first aspect of this disclosure, there is provided a driver circuit for driving a light source, the circuit comprising at least one current control unit, the current control unit comprising: a first node for coupling to a first terminal of the light source; a second node for coupling to a second terminal of the light source; a current source; a first current path, coupled between the first node and the current source; a second current path coupled between the second node and the current source, wherein the current control unit is operable: in a first mode of operation, to drive current from a first potential to a second potential to turn on the light source, wherein the said current is driven through the light source and through the first current path and the current source; and in a second mode of operation, to drive current from the first potential to the second potential and bypass the light source to turn off the light source, wherein the said current is driven through the second current path and the current source.

According to a second aspect of this disclosure, there is provided a method for controlling a light source using a driver circuit, the method comprising: operating at least one current control unit in the driver circuit, in a first mode, to drive a current from a first potential to a second potential to turn on the light source, wherein the said current is driven through the light source and through a first current path and a current source in the current control unit; and operating the at least one current control unit, in a second mode, to drive a current from the first potential to the second potential to turn off the light source, wherein the said current is driven through a second current path and the current source in the current control unit.

According to a third aspect of this disclosure, there is provided a method for controlling a light source using a driver circuit, the method comprising: applying a pre-drive current to the light source by operating a first set of the plurality of current control units in the driver circuit in a first mode and operating a second set of the plurality of current control units in a second mode; applying a drive current to the light source by operating the first set of the plurality of current control units in the driver circuit in the first mode and operating the second set of the plurality of current control units in the first mode, wherein the drive current is the sum of the current generated by the first set and the second set of the plurality of current control units, wherein in the first mode, current is driven from a first potential to a second potential, wherein the said current is driven through the light source and through a respective first current path and a respective current source in each of the plurality of current control units operating in the first mode, and wherein in the second mode, current is driven from the first potential to the second potential, wherein the said current is driven through a respective second current path and the respective current source in each of the plurality of current control units operating in the second mode.

Further features of the disclosure are defined in the appended claims.

BRIEF DESCRIPTION OF THE DRAWINGS

The teachings of this disclosure will be discussed, by way of non-limiting examples, with reference to the accompanying drawings, in which:

FIG. 2c(ii) shows a second mode of operation of the driver circuit of FIG. 2b.

FIG. 4b shows a first mode of operation of the driver circuit of FIG. 4a.

FIG. 5 is a flow chart of a method for operating the driver circuit of FIG. 4a.

DETAILED DESCRIPTION

The present disclosure provides a driver circuit for a light source, for example a laser diode (such as a vertical cavity surface emitting laser diode—VCSEL) or an LED, and a related method of operating the circuit. The proposed driver circuit can be used, for example, in ToF systems for controlling a light source. The proposed driver circuit reduces the impact of parasitic inductances on the rise and/or fall time of excitation pulses supplied to the light source by the driver circuit.

Figure 1A:
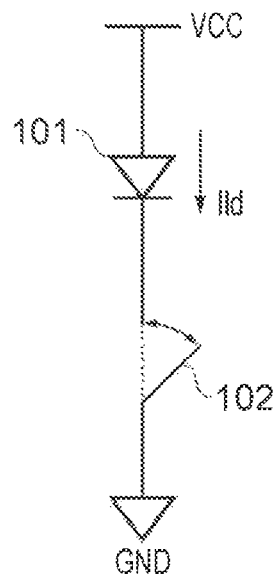
FIG. 1a shows an example representation of a conventional driver circuit for driving a light source 101, in this case, a laser diode.

FIG. 1a shows an example representation of a conventional driver circuit for driving a light source 101, in this case, a laser diode. The driver circuit comprises a switch 102 in series with the laser diode 101. In this circuit, the switch 102 may be toggled rapidly to supply excitation current pulses to the laser diode. Laser drive current, $I_{ld}$, is driven through the laser diode when the switch 102 is closed to turn on the laser diode. When switch 102 is open, the laser diode is turned off as no current flows through the diode.

Figure 1B:
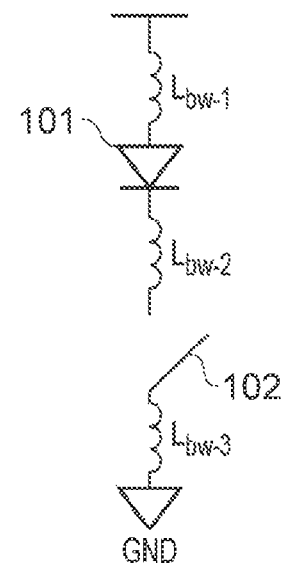
FIG. 1b shows the example circuit in FIG. 1a with parasitic inductances in the bondwires connecting the circuit elements.

In practical implementations of the circuit of FIG. 1a, there are parasitic inductances present in the bondwires or conductors which connect the elements of the circuit. FIG. 1b shows the example circuit in FIG. 1a with parasitic inductances in the bondwires connecting the circuit elements. In this case, there are three parasitic inductances of concern: (i) the parasitic inductance, $L_{bw\_1}$, between the supply voltage terminal (VCC) of the laser diode 101 (ii) the parasitic inductance, $L_{bw\_2}$, between the laser diode 101 and the switch 102 and (iii) the parasitic inductance, $L_{bw\_3}$, between the switch 102 the ground (GND) of the driver circuit. The sum of these three parasitic inductances, $L_{bw\_total}$, limits how fast the current will switch from low to high and vice versa—that is, these inductances limit the rise and fall time of the current pulses applied to the laser diode 101 as a result of toggling the switch 102.

The inventors have recognised that in order to achieve faster rise and fall times of current pulses applied to the laser diode 101, it may be helpful to reduce the effect of these parasitic inductances. One technique to address this issue is through advanced packaging techniques, which could potentially reduce the parasitic inductances enough to make the circuit operate faster, but these techniques suffer higher cost and assembly complexity. Furthermore, the parasitic inductances can never be completely eliminated, even with advanced packaging techniques.

The inventors have realised that it is possible to minimise the undesirable effect of parasitic inductances on the rise and fall times of excitation current pulses by modifying the design of the driver circuit. The proposed driver circuit implements a current control circuit that comprises a drive path, a bypass path and a current source, the current source being common to the drive path and the bypass path. In this circuit, to turn the light source off, the driver circuit may direct current to flow from a first potential to a second potential, via the bypass path and the current source of the current control unit. To turn the light source on, the driver circuit may direct current to flow from the first potential to the second potential via the drive path and the current source of the current control unit. The design of the driver circuit ensures a substantially constant current flow through at least some of the parasitic inductances. As a result, the effective total parasitic inductance or loop inductance is reduced, resulting in faster rise and fall times for the excitation current pulses.

Figure 2A:
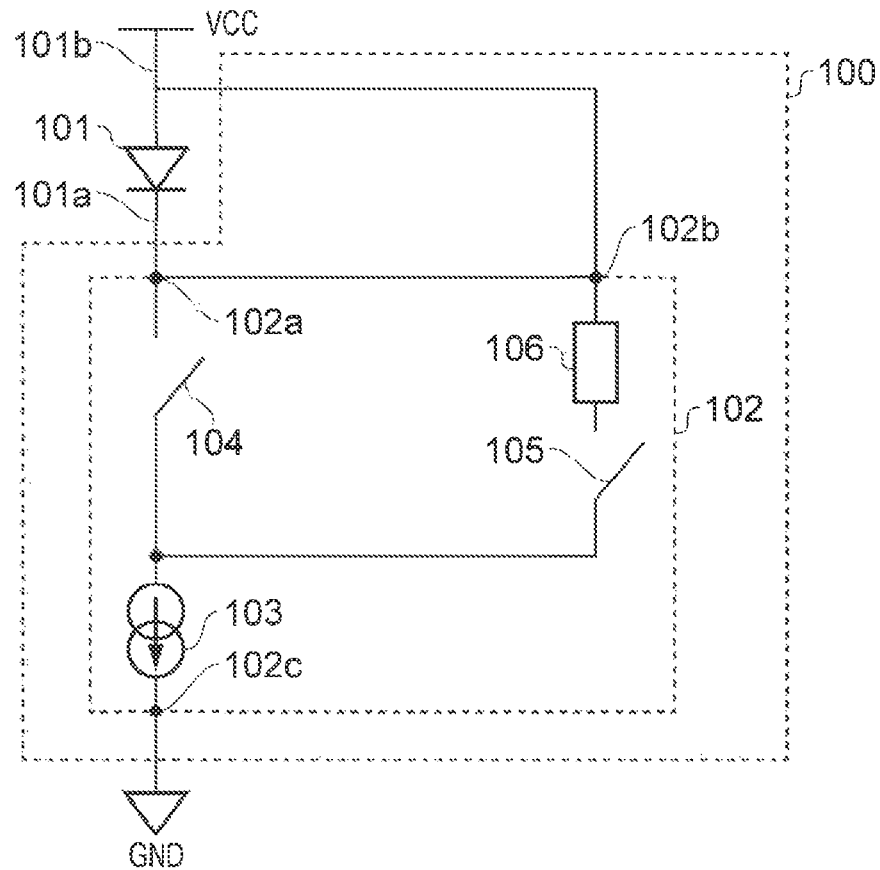
FIG. 2a shows a driver circuit 100 according to an aspect of the present disclosure.
Figure 2B:
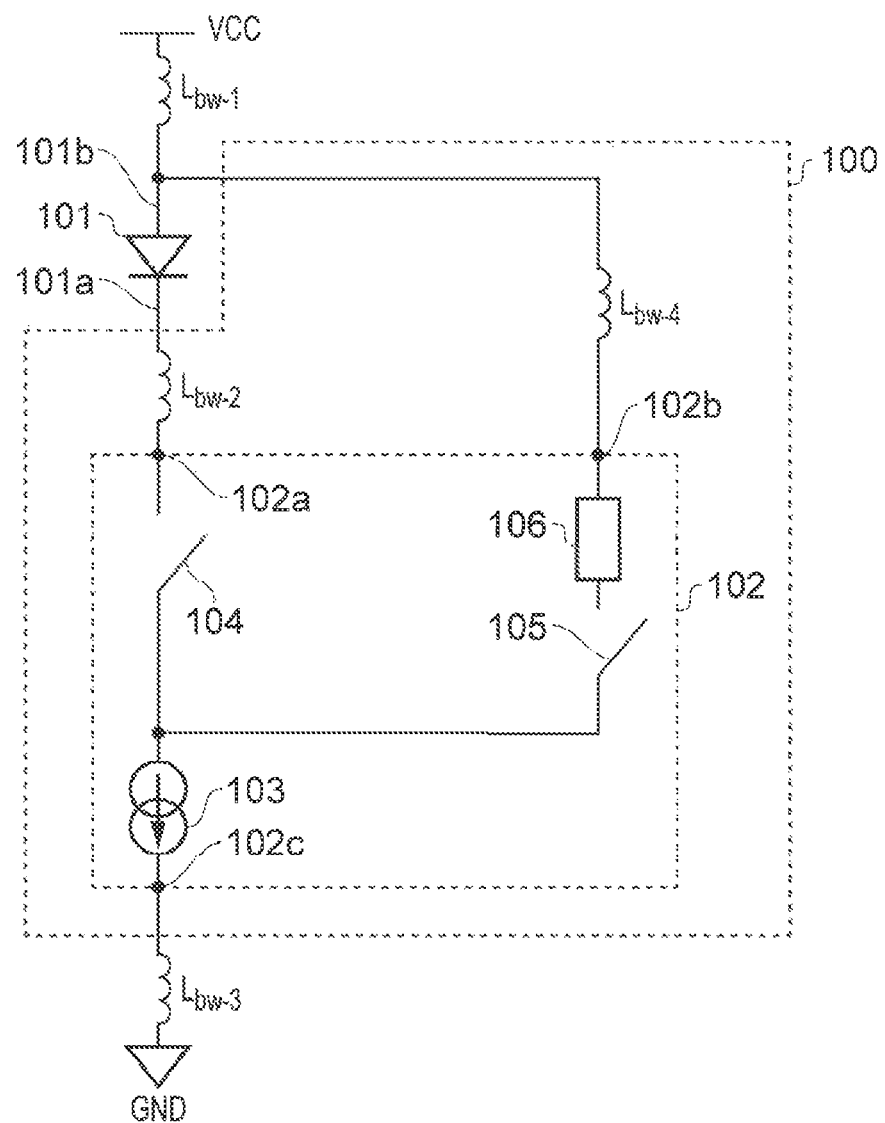
FIG. 2b shows the driver circuit 100 of FIG. 2a with parasitic inductances in the bondwire or conductor connecting the different circuit elements.

We will now describe the proposed driver circuit in more detail with reference to FIGS. 2a and 2b.

FIG. 2a shows a driver circuit 100 according to an aspect of the present disclosure. The driver circuit 100 is used to control the light source 101, in this case, the laser diode 101. The driver circuit 100 comprises a current control unit 102 for controlling the current flow in the circuit. The current control unit 102 comprises a first node 102a for coupling to a first terminal 101a of the laser diode 101 and a second node 102b for coupling to a second terminal 101b of the laser diode 101. The current control unit 102 also comprises a current source 103. The current source 103 can be designed to approximate a constant current source. The current control unit 102 also comprises a first current path (a drive path) comprising a first switch 104 coupled between the first node 102a and the current source 103. The current control unit 102 also comprises a second current path (a bypass path) comprising a second switch 105 coupled between the second node 102b and the current source 103. In some embodiments, the bypass path may also comprise an impedance unit or load 106 (for example, a resistor, or any other form of impedance element) in series with the second switch 105. The impedance of this load 106 can be designed such that the voltage drop across the load 105, when a current passes through the load 105, is substantially equal to the forward voltage of the laser diode 101 when the laser diode 101 is turned on.

FIG. 2b shows the driver circuit 100 of FIG. 2a with parasitic inductances in the bondwire or conductor connecting the different circuit elements. In this case there are four parasitic inductances: (i) the parasitic inductance, $L_{bw\_1}$, between the first potential (in this case, a supply voltage (VCC)) and the laser diode 101 (ii) the parasitic inductance, $L_{bw\_2}$, between a first terminal 101a of the laser diode 101 and the switch 104 (iii) the parasitic inductance, $L_{bw\_3}$, between the current source 103 and a second potential (in this case, ground (GND)) and (iv) the parasitic inductance, $L_{bw\_4}$ between a second terminal 101b of the laser diode 101 and the switch 105.

Figure 2C:
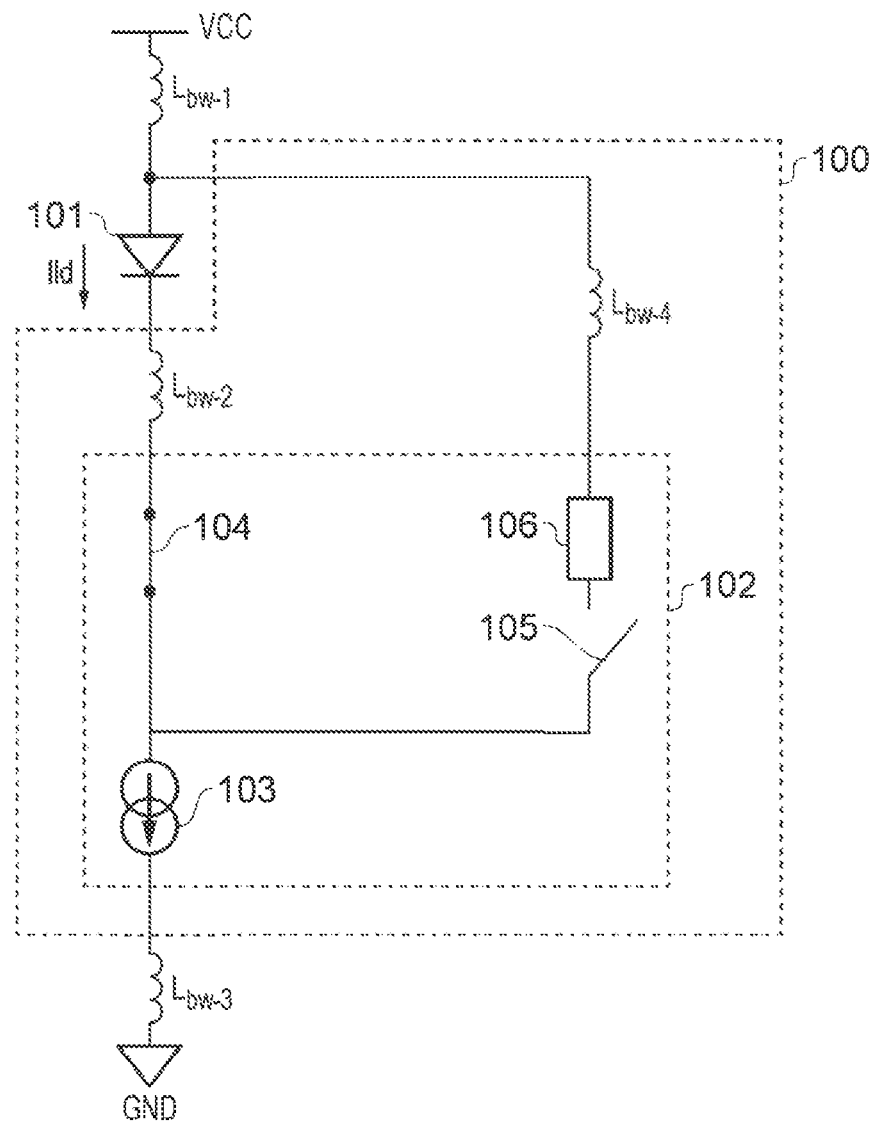
FIG. 2c(i) shows a first mode of operation of the driver circuit of FIG. 2b.
Figure 3:
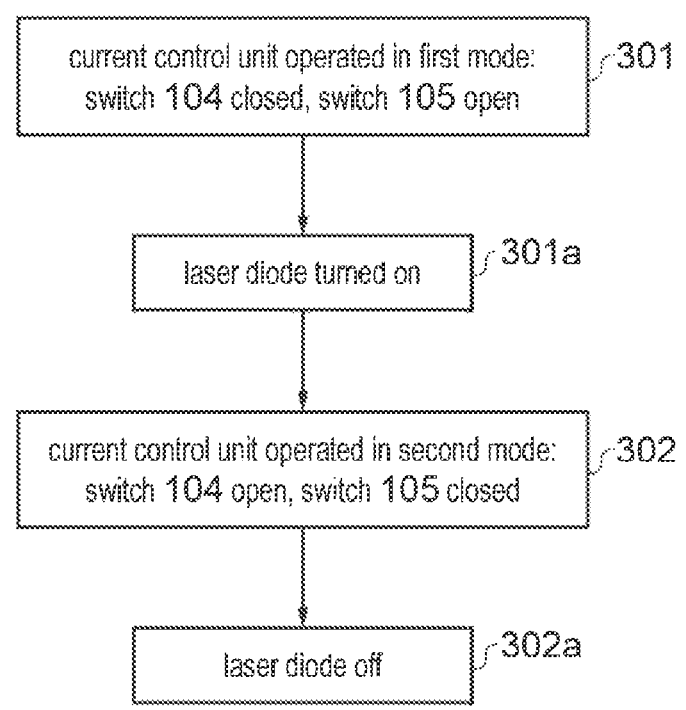
FIG. 3 is a flow chart of a method for operating the driver circuit of FIG. 2b.

The current control unit 102 in FIG. 2b can be operated in two modes for controlling the laser diode 101. These two modes of operation of the current control unit 102 are shown in FIGS. 2c(i), 2c(ii) and the flow chart in FIG. 3. As shown in FIG. 2c (i) and the corresponding method step 301 in FIG. 3, in a first mode of operation, the switch 104 is closed and switch 105 is open. In this first mode, the current control unit is used to turn on the laser diode 101 by enabling a drive current, $I_{ld}$, to flow through the laser diode 101, the drive path (comprising the switch 104) and the current source 103. As shown in FIG. 2c(ii) and the corresponding method step 302 in FIG. 3, in a second mode of operation, the switch 105 is closed and switch 104 is open. In this second mode, the current control unit 102 is used to switch off the laser diode 101 by enabling the current $I_b$ in the drive circuit 100 to bypass the laser diode 101 and flow through the bypass path (comprising the switch 105) and current source 103.

The driver circuit 100 in FIG. 2b addresses the limitations of the conventional circuit in FIG. 1b. By implementing the bypass path in the current control unit 102, the current source 103 may approximate a constant, or ideal, current source when switch 104 is in the off-state, since the bypass path may then be used to provide a current path for the current in the drive circuit 101 to flow to the current source 103 in the second mode of the current control unit 102, as explained above. The parasitic inductance $L_{bw\_3}$ in FIG. 2b is therefore in series with the constant current source 103. The current source 103 results in the current through the parasitic inductance $L_{bw\_3}$ being substantially constant, such that it may be effectively neutralised to a first order and therefore does not contribute to the total parasitic inductance, $L_{bw\_total}$, of the circuit. That is, as a result of the configuration of the driver circuit 100 in FIG. 2b, the parasitic inductance $L_{bw\_3}$ does not have an impact on the rise and fall time of the excitation current pulses applied to the laser diode 101.

In the driver circuit 100 of FIG. 2b, the parasitic inductance, $L_{bw\_1}$, between the supply voltage VCC and the laser diode 101 may be effectively neutralized to a first order by being made to carry a substantially constant current during both modes of operation. That is, the effect of the parasitic inductance $L_{bw\_1}$ on the rise and fall time of excitation current pulses can be minimised or nearly completely avoided by designing the circuit 100 such that the bondwire between the supply voltage VCC and the laser diode 101 carries a substantially constant current during both modes of operation. This can be realised by including the current source 103 and by implementing the switch 104 to have substantially the same on-state impedance as the switch 105 (for example, by using the same design of switch for both switch 104 and switch 105) and setting the impedance of load 106 such that the voltage drop across the load during the second mode of operation is substantially the same as the on-state voltage drop of the laser diode 101 (i.e., the first and second current paths are configured such that the combined voltage across the laser diode 101 and the first current path during the first mode of operation is substantially the same as the voltage drop across the second current path during the second mode of operation). As a result, the current paths are balanced in that the current driven through switch 104 and laser diode 101 in a first mode of operation of the current control unit 102 is similar to, or substantially the same as the current driven through the load 106 and the switch 105, in a second mode of operation of the current control unit 102, and the voltage across the current source 103 should be substantially the same in both the first and second mode of operation such that the current source 103 may approximate a constant, or ideal, current source 103. As a result, the total parasitic inductance $L_{bw\_total}$, which limits the rise and fall time of the excitation current pulses applied to the laser diode 101, may now effectively comprise only, $L_{bw\_2}$, which is the parasitic inductance between the laser diode 101 and the switch 104 or the parasitic inductance of the first terminal 101a of the laser diode 101. In this way, the design of the driver circuit 100 of FIG. 2b advantageously reduces the impact of the parasitic inductances $L_{bw\_1}$ and $L_{bw\_3}$ on the rise time of excitation current pulses, thereby resulting in substantially only $L_{bw\_2}$ acting as the primary rise time degradation source. The impact of parasitic inductance, $L_{bw\_2}$, may also be reduced in a practical implementation of the driver circuit 100 by, for example, selecting a wafer level chip scale package (WLCSP) with low parasitic bump inductance. Optionally, the impact of parasitic inductance $L_{bw\_1}$, may be minimised by coupling the second node 102b as close as possible to the laser diode terminal 101*b* (for example, by direct connection to the terminal 101*b* using a conductor such as a bonding wire between the second node 102*b* and the laser diode terminal 101*b*). In this way, in both modes of operation substantially the same current should flow through as much of the current path between VCC and terminal 101*b* as possible, thereby meaning that the impact of parasitic inductance, $L_{bw\_1}$ may be minimised.

The design of the driver circuit 100 in FIG. 2*b* has enabled the inventors to realise laser diode driver circuits with a frequency in the region of 300 MHz for generating current pulses with relatively high peak currents, for example current pulses with a peak value of greater than 2 A (for example a peak value of 3 A, or 4 A or 5 A) and a short rise/fall time, for example, rise/fall time (for example, less than ins, such as 0.5 ns, or 0.4 ns, etc). The driver circuit 100 may therefore be particularly useful for ToF systems, enabling a good depth accuracy and range. The inventors have been able to demonstrate this performance of driver circuit 100 with reduced power consumption as compared with conventional driver circuits, for example, with a supply voltage as low as 3V and a loop inductance of up to 1.5 nH. Furthermore, the reduction in loop inductance has enabled a larger drive current to be delivered to the light source 101 for the same supply voltage, such that, for example, a peak current of 3 A may be achieved for a supply voltage of 3V, or a peak current of 4 A may be achieved for a supply voltage of 5V.

Figure 2D:
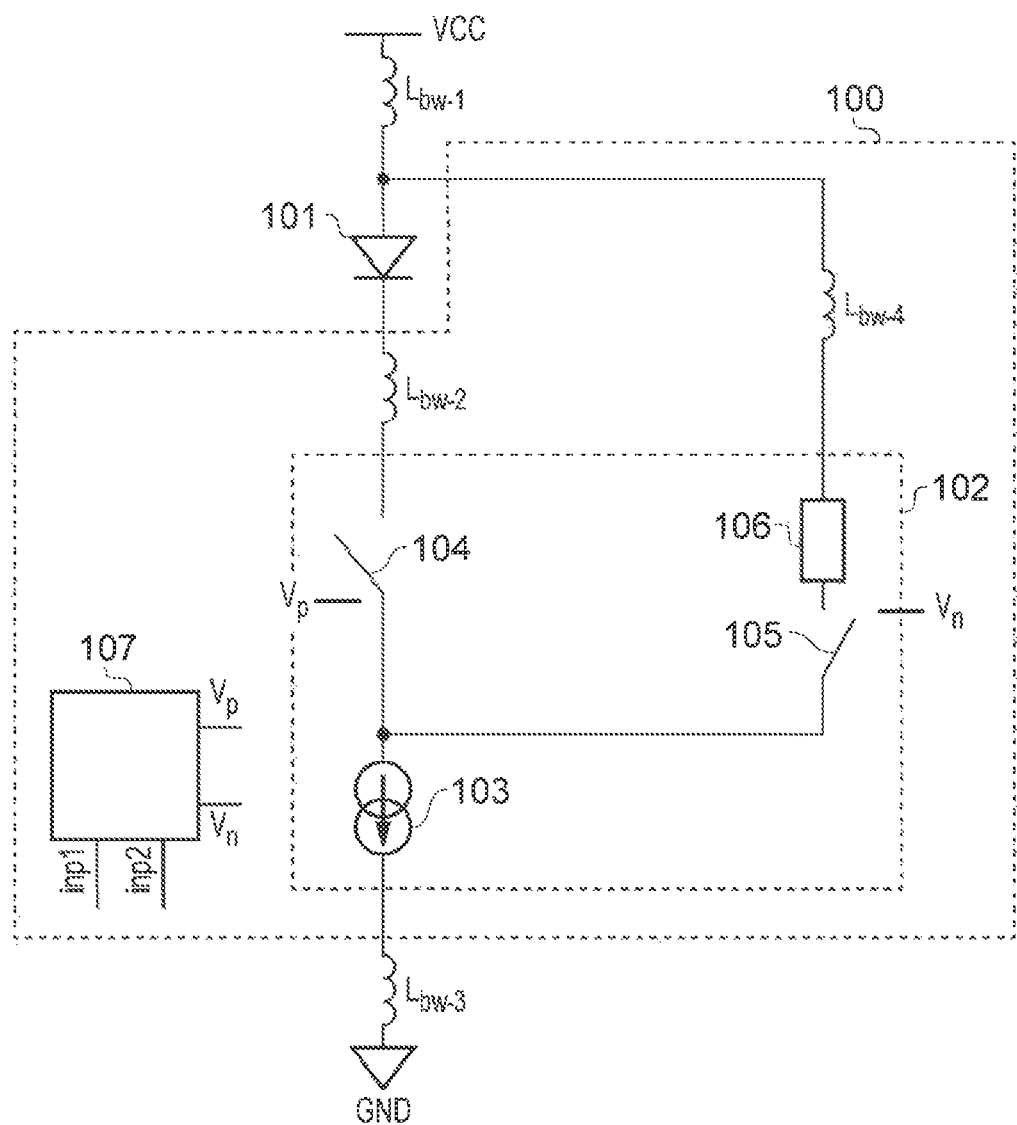
FIG. 2d shows the driver circuit of FIG. 2b comprising a controller.

The switches 104, 105 and the current source 103 in FIG. 2*b* can each comprise one or more transistors, for example, bipolar transistors (such as BJTs) or FETs (such as MOSFETS, for example DMOS transistors). For example, each switch may be implemented by a transistor, where control signal vp or vn is applied to the gate/base of the transistor in order to turn on and turn off the transistor, thereby closing or opening the switch. As shown in FIG. 2*d*, in some embodiments, the driver circuit 100 can also comprise a controller 107 for supplying control signals Vp and Vn to control the operation of the switches 104 and 105, respectively, thereby controlling the mode of operation of the current control unit 102. FIG. 2*d* the controller 107 is represented as having two input signals, inp1 and inp2, which may be used to provide the controller 107 with suitable instructions, for example timing instructions and/or an indication of desired drive and pre-drive currents etc. It will be appreciated that the controller 107 may be configured to receive any number of input signals for this purpose, or receive no input signals and be autonomous. Furthermore, in some embodiments the current control unit 102 can be configured to receive a biasing signal (not shown) to bias the current source 103. The biasing signal may be controlled by the controller 107, or any other suitable circuit/device.

Figure 2E:
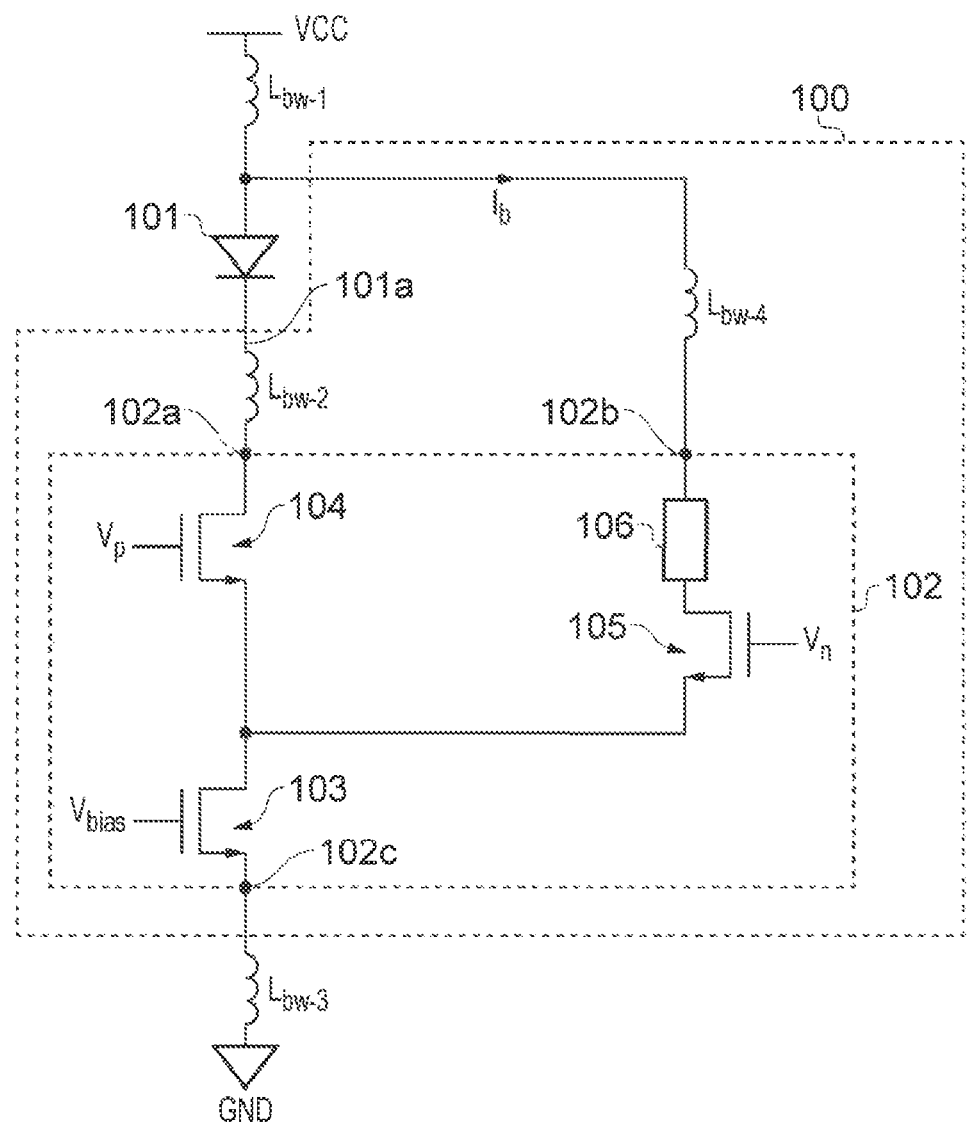
FIG. 2e shows the driver circuit 100 of FIG. 2b with the switches and the current source comprising NMOS transistors.

FIG. 2*e* shows a non-limiting example implementation of the driver circuit 100 of FIG. 2*b* with the switches 104, 105 and the current source 103 comprising NMOS transistors.

In addition to reducing the impact of parasitic inductance of the rise/fall time of excitation current pulses, another design consideration when implementing a driver circuit for driving a light source, is the efficient use of the die area. For example, adding functionality for separately controlling predrive and drive currents through the light source 101 can result in complex circuit designs which occupy large die areas. The inventors have realised a simpler, efficient topology for implementing the driver circuit 100 with functionality to provide predrive and drive currents to the light source 101. In particular, the inventors have realised that it is possible to have a programmable/reconfigurable design of the driver circuit 100 to enable flexibility in the operation of the driver circuit 100 for application of predrive and drive currents. An example of such a design for a driver circuit 100, according to an aspect of this disclosure, is shown in FIGS. 4*a*-4*c*.

Figure 4A:
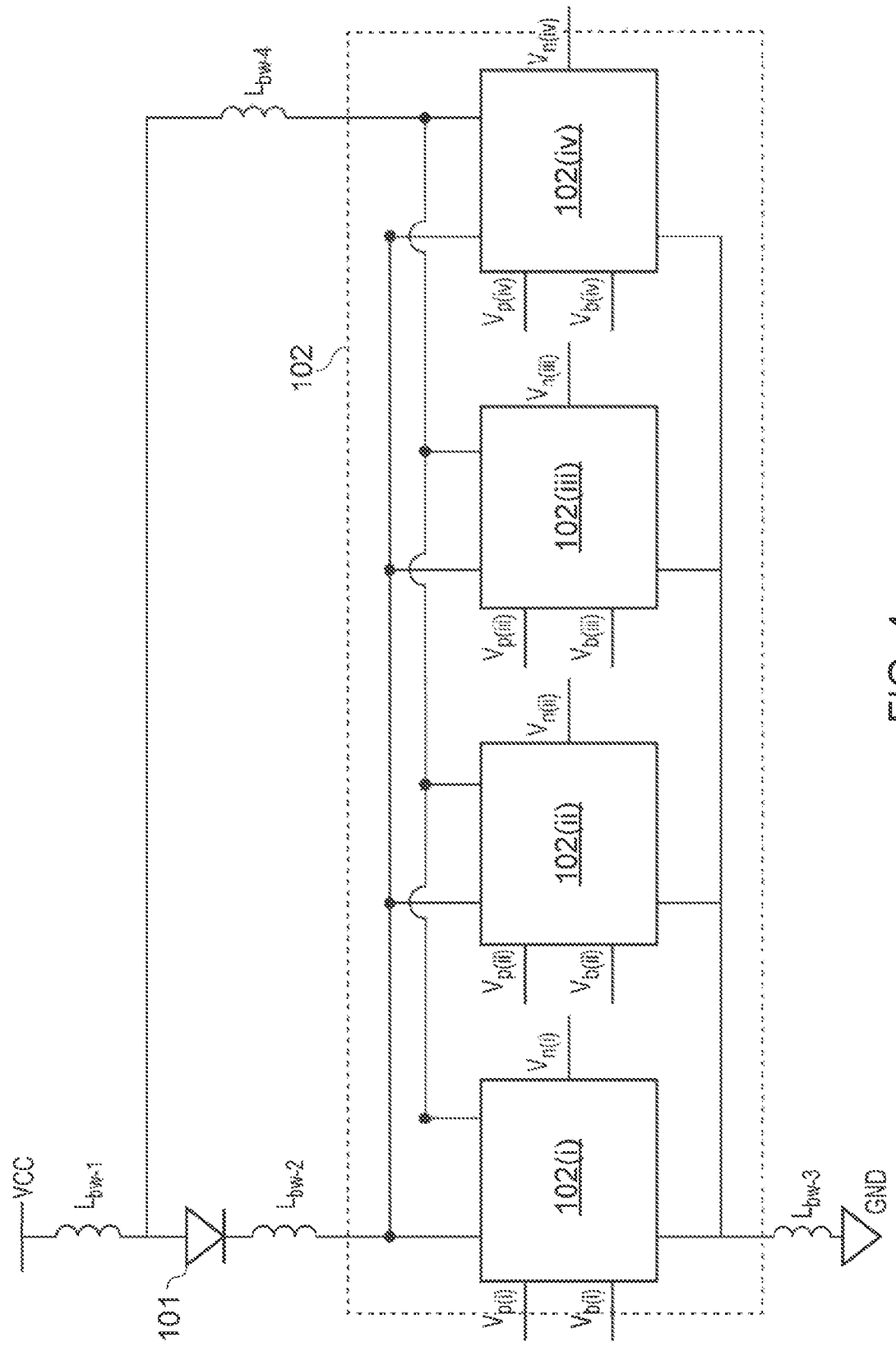
FIG. 4a shows an example of a driver circuit according to a further aspect of the present disclosure.

The driver circuit 100 of FIG. 4*a* comprises a plurality of current control units, in this example: current control units 102(i), 102(ii), 102(iii) and 102(iv) are coupled in parallel at their respective first nodes (102(i)(a), 102(ii)(a), 102(iii)(a), 102(iv)(a)) and second nodes (102(i)(b), 102(ii)(b), 102(iii)(b), 102(iv)(a)). The design of each of the current control units is identical to the current control unit 102 as described in FIG. 2*b*. In FIG. 4*a*, the current control units also share a second potential (in this example, a common ground connection (GND)). Each of the plurality of current control units is independently operable in the first mode and second mode of operation (for example, at any one time, some of the current control units may operate in the first mode, and others of the current control units may operate in the second mode). In addition to the two modes of operation of the current control unit as already explained above with respect to FIG. 2*b*, each of the plurality of current control units can be operated in a third mode, where both switches 104 and 105 are open thereby electrically decoupling the current control unit 102 from the laser diode 101.

Figure 4B:
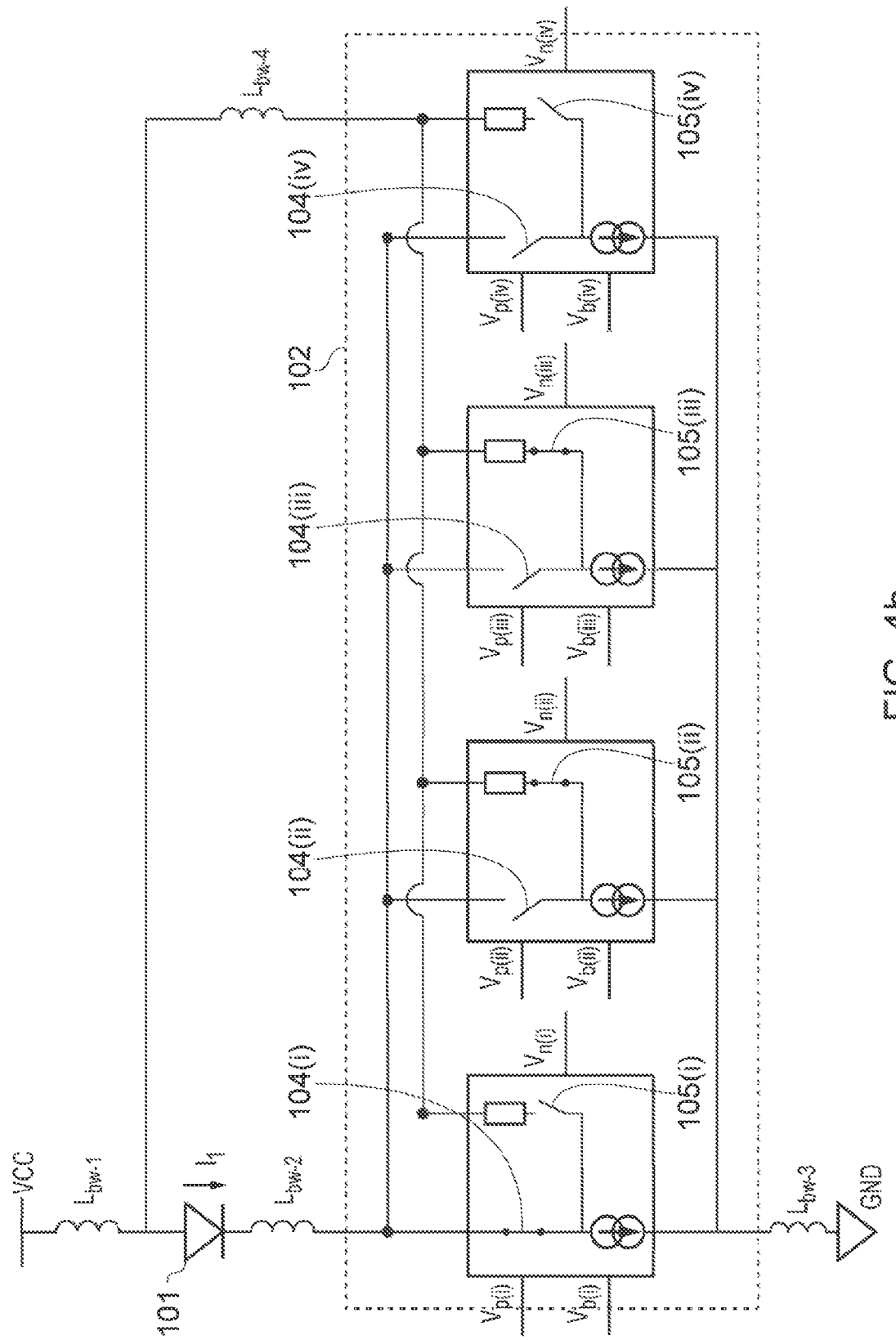
Figure 4C:
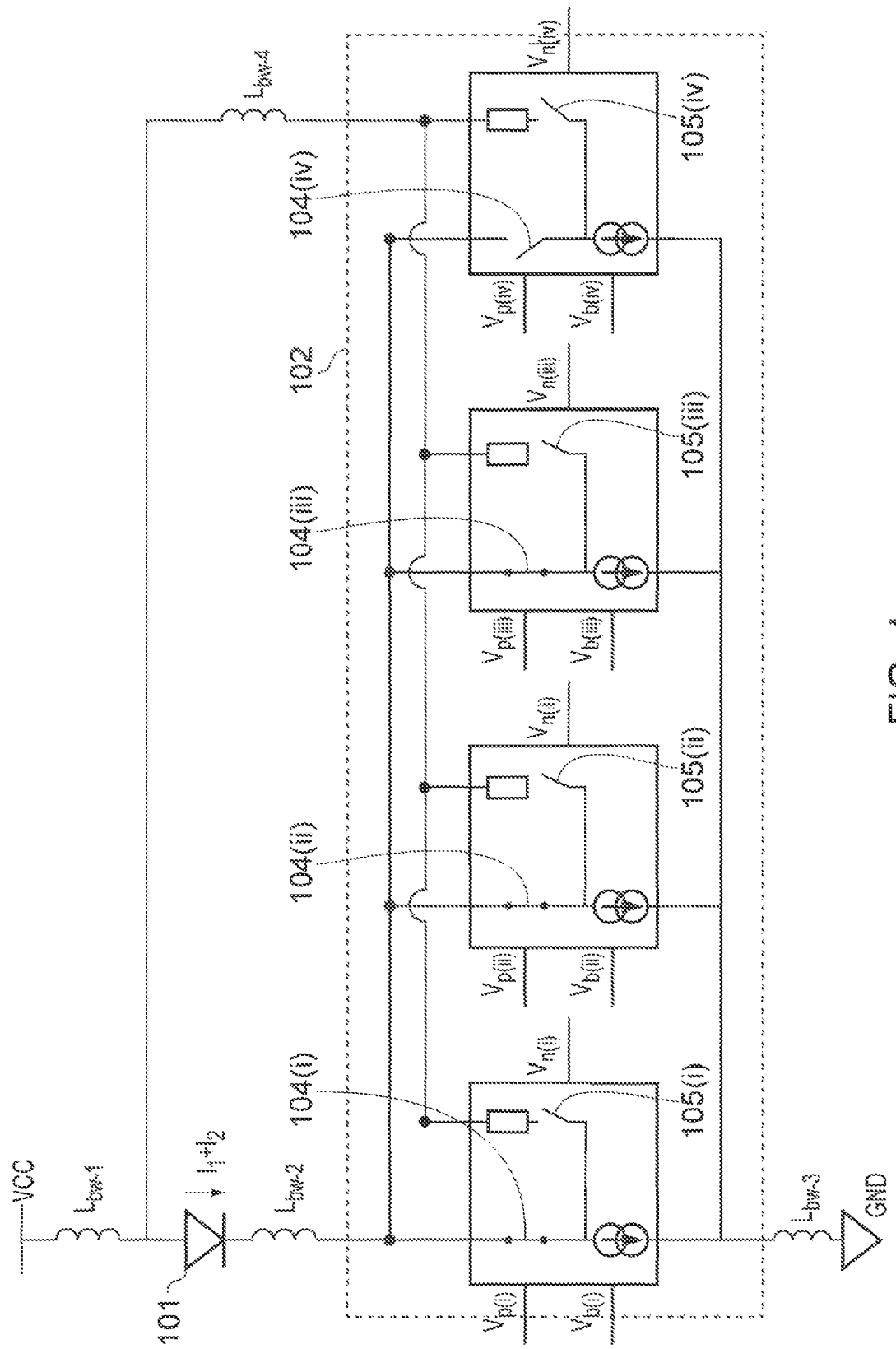
FIG. 4c shows a second mode of operation of the driver circuit of FIG. 4b.
Figure 5:
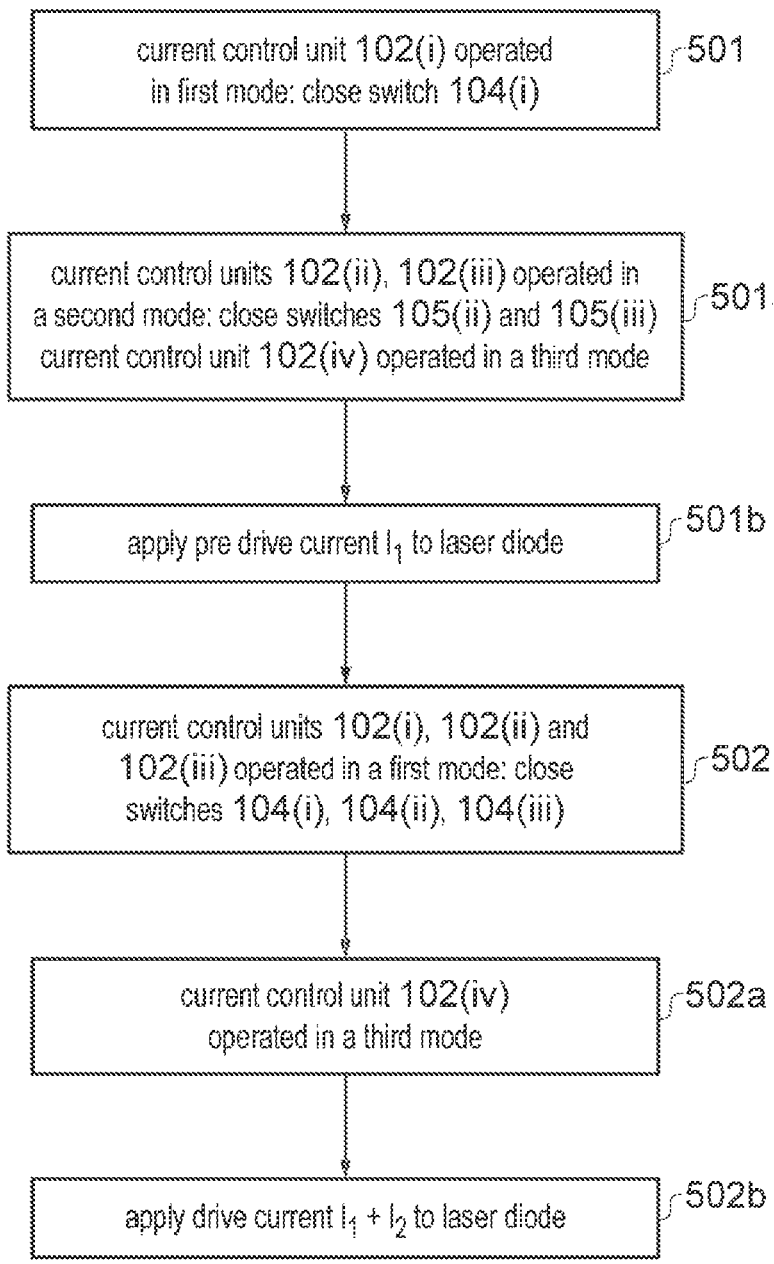

FIGS. 4*b* and 4*c* show examples of operating the driver circuit 100 of FIG. 4*a* to apply a predrive current and drive current, respectively, to the laser diode 101. FIG. 5 shows a flow chart corresponding to the method steps relating to the operations shown in FIGS. 4*b* and 4*c*. In FIG. 4*b*, a first set of current control units (which in this particular example consists of only the current control unit 102(i)) is operated in the first mode by closing switch 104(i) and opening switch 105(i) (step 501 in FIG. 5). A second set of current control units (which in this particular example consists of the current control units 102(ii) and 102(iii)) are each operated in the second mode by opening their respective switches 104(ii), 104(iii) and closing their respective switches 105(ii), 105(iii) (step 501*a* in FIG. 5). A third set of current control units (which in this particular example consists of only the current control unit 102(iv)) is operated in the third mode by opening its switches 104(iii) and 105(iii) to electrically decouple current control unit 102(iv) from the laser diode 101 (step 501*a* in FIG. 5). As a result of each of the control units operating in the modes as described above, and as also shown in FIG. 4*b*, a current, I1, may be applied to the laser diode 101 using the current control unit 102(i) (step 501*b* in FIG. 5). The current I1 may be a pre-drive current for the laser diode 101. Bypass currents also flow through the bypass paths of current control units 102(ii) and 102(iii).

In FIG. 4*c*, the current control unit 102(i) is maintained in its first mode of operation (step 502 in FIG. 5). Additionally current control units 102(ii) and 102(iii) are also operated in their first modes by closing their respective switches, 104(ii) and 104(iii) (step 502 in FIG. 5). The current control unit 102(iv) is maintained in the third mode of operation, that is, it is electrically decoupled from the laser diode 101 (step 502*a* in FIG. 5). As a result of this configuration, as also indicated in FIG. 4*c*, a current I2 is applied to the laser diode 101 in addition to the predrive current I1. I2 is the sum of the currents supplied by 102(ii) and 102(iii) operating in the first mode (and may be substantially equal to the sum of the bypass current that flow through the bypass paths of 102(ii) and 102(iii) when they are operating in the second mode), and I1 is the pre-drive current applied by 102(i) operating in the first mode. Therefore, in FIG. 4*c*, there is now a drive current $I_{id}$, flowing through the laser diode 101, where the drive current Ild is the sum of the current I1 generated by 102(i) and I2 generated by 102(ii) and 102(iii), with these three current control units being operated in a first mode.

FIGS. 4a-c show four current control units coupled in parallel with each other. In other implementations, the driver circuit 100 can comprise of any number of current control units coupled in parallel with each other, for example, 2, 3, 10, 20, 50, etc. The number of current control units operating in a first mode to apply a predrive current to the laser diode 101 (i.e., the number of current control units in the 'first set' of current control units), can be chosen depending on the desired value of the predrive current. The larger the number of current control units in the first set, the larger the applied predrive current will be. Similarly, the number of additional current control units that operate in the second mode whilst the predrive current is being applied and then switch to the first mode to apply a drive current to the laser diode 101 (i.e., the number of current control units in the 'second set' of current control units), can be chosen depending on the desired value of the drive current. That is, the number of additional current control units that switch between the first and second mode in order to switch been drive current and pre-drive current, can be chosen, for example based on a difference between a desired drive current and the pre-drive current. For example, in FIG. 4c, the value of current I2 generated by 102(ii) and 102(iii) operating in the first mode, may be equal to the difference between the desired drive current $I_{ld}$ and desired pre-drive current I1, which is already applied by current control unit 102(i) operating in the first mode. In this example, the current control unit 102(iv) is operated in the third mode of operation throughout, since its contribution is not required in order to achieve the desired pre-drive current and desired drive current. That is to say, once the number of current control units for the first set and the second set has been determined, any remaining current control units in the current drive 100 may simply be operated in the third mode of operation. A controller 107, or any other suitable device or circuit, may independently control each of the current control units (for example, using independent control signals vp and vn for each current control unit) so as to set the pre-drive current and the drive current that the current driver 100 applies to the laser diode 101.

In this way, with a built-in programmability for supplying pre-drive and drive currents, the driver circuit 100 of FIGS. 4a-4c may advantageously enable the die-area to be used efficiently—that is, the circuit 100 of FIGS. 4a-4c may enable the current control units to be individually programmed in different modes of operation, as described above, to achieve a desired drive current while simultaneously enabling coarse modulation and pre-drive current control.

Figure 6A:
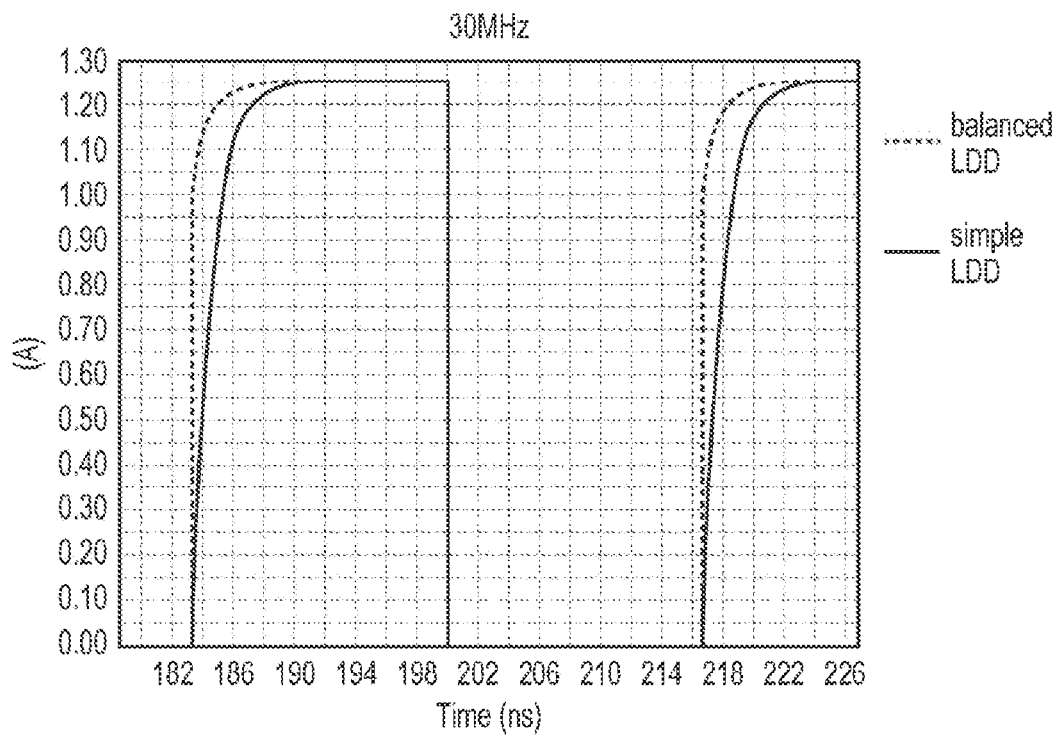
FIGS. 6a and 6b show simulation results comparing the excitation current pulses as supplied by the driver circuit according to the current driver of the present disclosure with the excitation current pulses as supplied by a simple driver circuit.
Figure 6B:
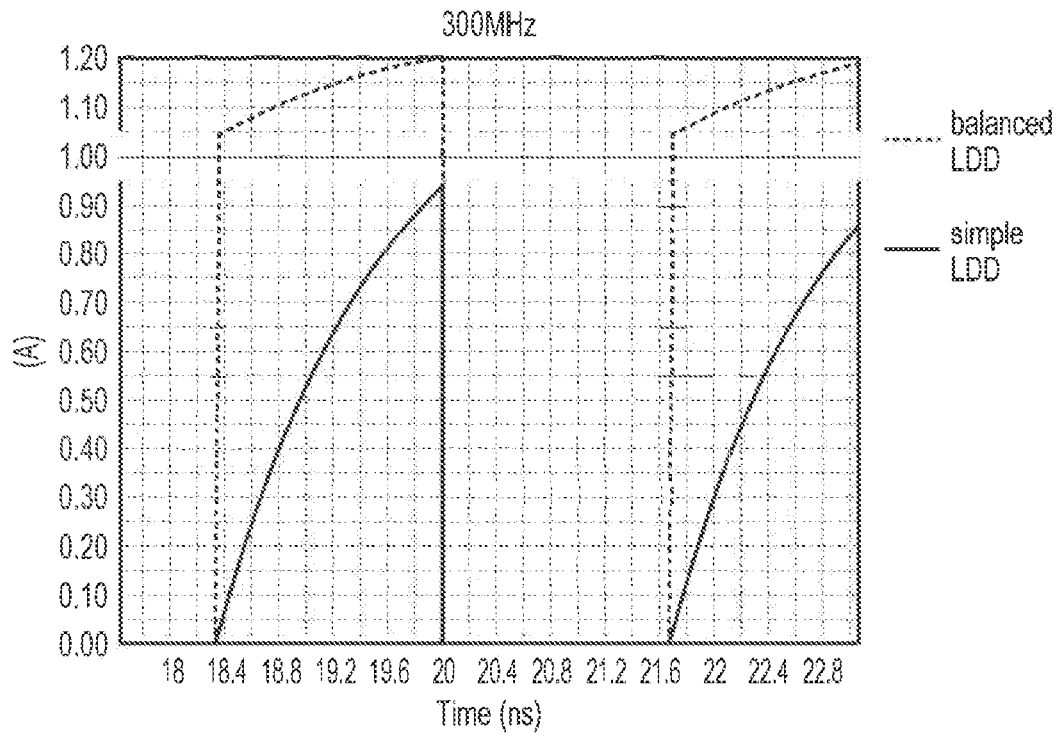

FIGS. 6a and 6b show simulation results comparing drive current pulses as supplied by the driver circuit according 100 to the present invention ('balanced LDD' in the FIGS. 6a and 6b) with the excitation current pulses as supplied by a simple driver circuit ('simple LDD' in FIGS. 6a and 6b—see FIGS. 1a and 1b for examples of a simple LDD). As seen in FIGS. 6a and 6b, the laser driver 100 of the present disclosure provides an improved excitation pulse with faster rise time and higher peak drive currents. This improvement is particularly evident when the respective driver circuits are operated at a frequency of 300 MHz: for example, by halfway through each pulse (for example, at time 19.2 ns in FIG. 6b), the driver circuit 100 of the present disclosure may apply an increase of 1.15 A to the laser diode 101, whereas the simple driver circuit may only have applied an increased current of 0.65 A. It will be appreciated that the units represented in FIGS. 6a and 6b are non-limiting, arbitrary units, and the driver circuit 100 may configured to apply different magnitudes of current to the laser diode 101 (such as currents of 3 A or greater), for example depending on the potentials to which the driver circuit 100 is coupled, the nature of the current source(s) in the driver circuit 100 and/or the number of current control units 102 that are operated the first mode of operation to apply a drive current to the laser diode 101.

Although this invention has been described in terms of certain embodiments, the embodiments can be combined to provide further embodiments. In addition, certain features shown in the context of one embodiment can be incorporated into other embodiments as well.

Whilst the light source 101 is defined to be a laser diode, it is not necessarily limited to this type—the driver circuit 100 and associated methods for operating it, may be used with any type of light source requiring a driver circuit, for example an light emitted diode (LED). For ToF applications, the laser diode may, for example, be a high power vertical cavity surface emitting laser diode. When the current driver 100 includes a controller 107, it will may be implemented in any suitable way that can control the different operating modes, for example, by using a microcontroller(s), programmable logic arrays or even as software that executes on one or more processors to perform a given operation. Whilst the invention is particularly useful for calibrating laser drive times for use in ToF applications, it is not limited to this application and may be equally useful for any application which implements a laser diode.

The use of the term 'coupled' throughout the description, particularly in relation to the embodiments describing the driver circuit, is to be interpreted to mean a direct or indirect connection between components in the circuit. For example, two components being described as coupled to each other can mean that they are directly connected by a conductor or indirectly connected via another component in between the two components.

The current source 103 may be implemented in any suitable way, for example using a transistor, such as a FET, with a drain terminal coupled to switches 104 and 105, a source terminal coupled to the second potential (for example, GND) and a gate terminal biased by any suitable bias voltage. In the technical field, the term 'current source' is often used interchangeably with the term 'current sink'. The use of the term 'current source' throughout this disclosure also encompasses current sinks.

Figure 6C:
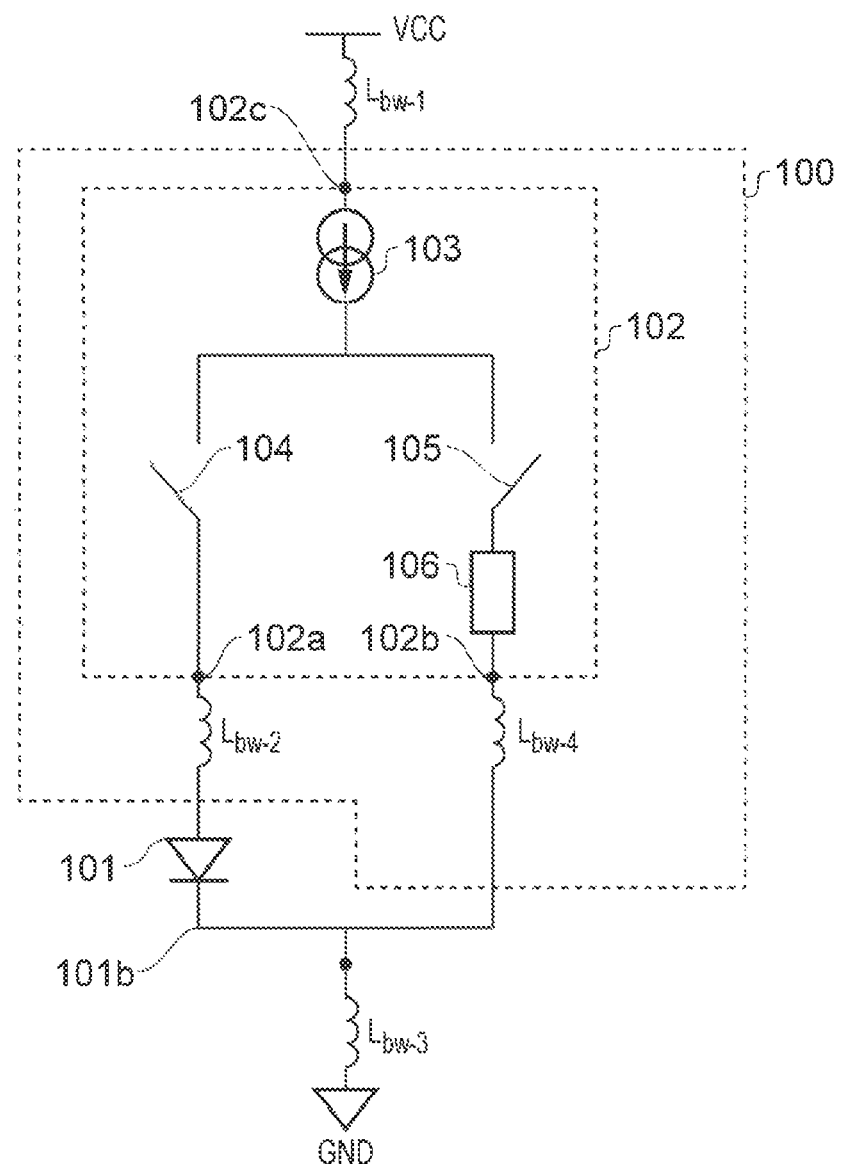
FIGS. 6c(i) and 6c(ii) show a driver circuit 100 according to another aspect of this disclosure.
Figure 7:
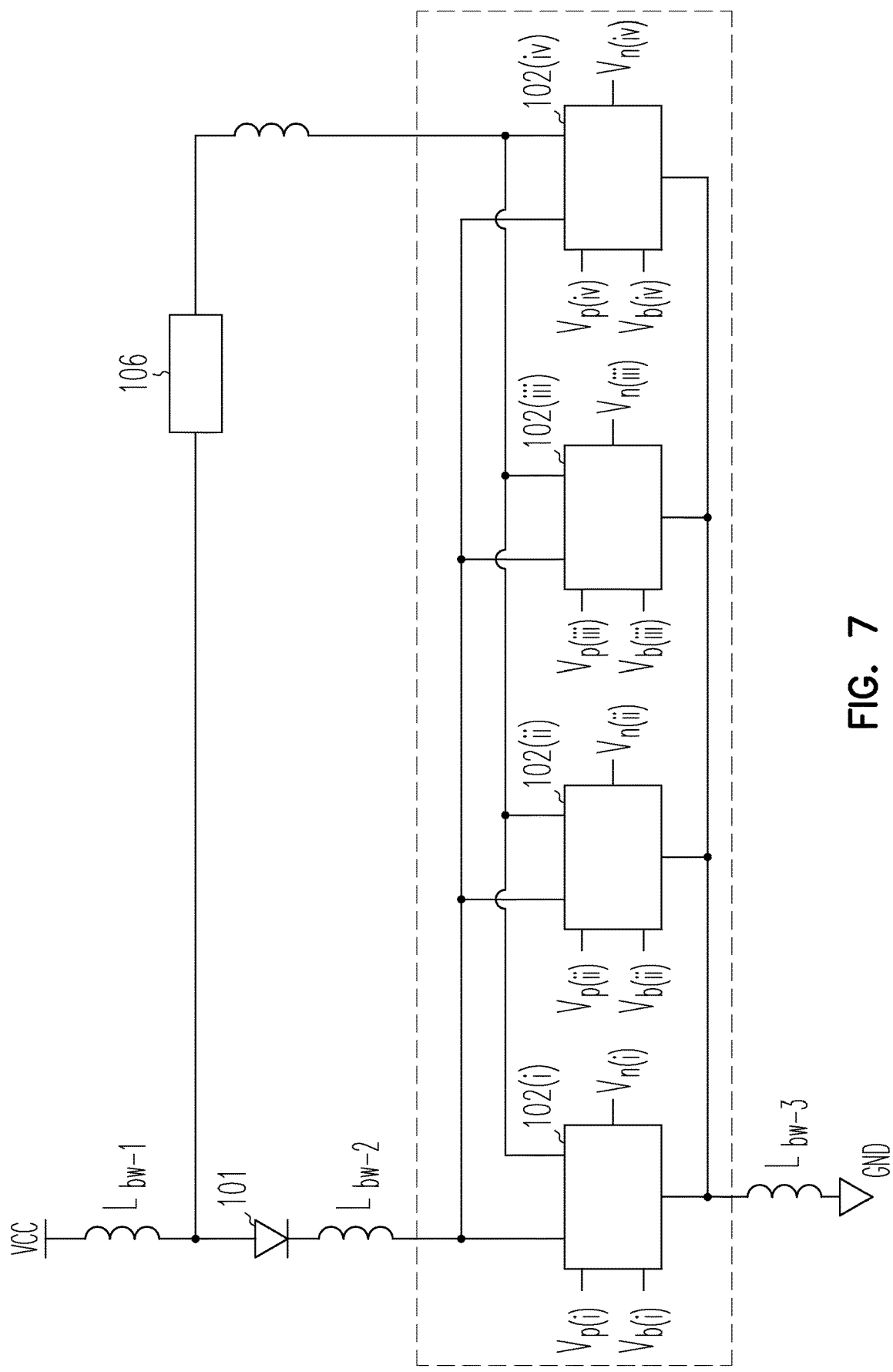
FIG. 7 shows an example of a driver circuit where the plurality of current control units can share an impedance unit.

FIG. 6c(i) shows an alternative implementation for the driver circuit 100 according to a further aspect of this disclosure. One example of this alternative implementation is when the switches 104, 105 and current source 103 of the driver circuit 100 comprise PMOS transistors as shown in FIG. 6c(ii). The operation of the driver circuit 100 of FIG. 6c is consistent with the operation of the driver circuit 100 in FIG. 2b. That is, in the first mode of operation of the driver circuit 100 of FIG. 6c, current flows from a first potential (VCC) to a second potential (GND) to turn on the light source 101, where the said current is driven through the light source 101 and through the first current path 104 and the current source 103. In the second mode of operation of the driver circuit 100 of FIG. 6c, the current flows from the first potential to the second potential to bypass the light source 101 and turn off the light source 101, where the said current is driven through the second current path 105 and the current source 103.

The driver circuit 100 described in the different aspects above is coupled to two potentials, a first potential, which is VCC, and a second potential, which is GND, where VCC is a higher potential than GND. However, driver circuit 100 is suitable for coupling to any two suitable potentials between which current may flow.

In the above example implementations of the driver circuit 100, the current control unit(s) 102 include a load or impedance unit 106. However, in an alternative, this may be omitted and the combined voltage drop across the light source and the first current path (drive path) during the first mode of operation still substantially matches the voltage drop across the second current path during the second mode of operation (for example, if the on-state impedance of the light source 101 is so low that it does not cause any significant or appreciable voltage drop during the first mode of operation, or by designing switch 105 to have an on-state voltage drop that substantially matches the combined on-state voltage drop of the light source 101 and the switch 104). In a further alternative, where a plurality of current control units are coupled together, such as represented in FIG. 4a, each current control unit 102 may comprise a load or impedance unit 106, or a single common load or impedance unit may be included in the driver circuit 102 such that for current control units 102 operating in the second mode, current may flow through the single common load and then branch to each of the current control units 102. In this case, the common load may be considered to be part of the second current path for all of the current control units, such that the combined voltage drop across the light source and the first current path (drive path) during the first mode of operation would still substantially match the voltage drop across each of the second current paths during the second mode of operation.

In the above, it is explained that the current source 103 may operate as a 'substantially' constant current source and that the current flowing between VCC and GND, through the current source 103, may be 'substantially' the same in both the first and second modes of operation. The more closely matched the currents are between the first and second mode of operation, the lower the loop inductance may be and the less the parasitic inductances may affect the speed with which current may rise and fall in the light source 101. However, the extent to which the current flow in the first and second modes of operation are the same may depend on the operational requirements of the current driver 100 and on the quality/tolerances of the circuit components. Therefore, throughout this disclosure the term, 'substantially' (in the context of voltage drops, impedances and current) may mean constant within the bounds of quality/tolerances of circuit components (which may have quality/tolerances of, for example, +/−1%, or +/−5%, or +/−10%, etc).

The invention claimed is:

1. A driver circuit for driving a light source in a time-of-flight camera system, the driver circuit comprising:
a plurality of current control units, an individual one of the plurality of current control units comprising:
a first node for coupling to a first terminal of the light source;
a second node for coupling to a second terminal of the light source;
a current source;
a first current path, coupled between the first node and the current source;
a second current path comprising an impedance unit configured to provide an impedance coupled between the second node and the current source, wherein the individual one of the plurality of current control units is operable:

in a first mode of operation, to drive current from a first potential to a second potential to turn on the light source, wherein the said current is driven through the light source and through the first current path and the current source; and
in a second mode of operation, to drive current from the first potential to the second potential and bypass the light source to turn off the light source, wherein the said current is driven through the second current path and the current source; and
wherein the impedance unit is configured such that a voltage drop across the second current path during the second mode of operation matches a combined voltage drop across the light source and the first current path during the first mode of operation;
wherein a first current control unit of the plurality of current control units is operable in the first mode of operation for applying a pre-drive current to the light source, and a second current control unit of the plurality of current control units is operable in the first mode of operation for applying a drive current to the light source, wherein applying the pre-drive current occurs prior to switching to applying the drive current;
wherein the pre-drive current is determined based on a count of current control units that operate during applying the pre-drive current; and
wherein the drive current is determined based on the count of current control units that operate during applying the pre-drive current prior to the switching to applying the drive current and a count of additional current control units to be employed during the applying the drive current to provide a desired value of the drive current; and
wherein each of the plurality of current control units is operable to, in a third mode of operation, be electrically decoupled from the light source.

2. A driver circuit according to claim 1 wherein the individual one of the plurality of current control units further comprises a third node for coupling the current source to the second potential.

3. A driver circuit according to claim 1 wherein the individual one of the plurality of current control units is configured to:
receive a first control signal for controlling the first mode of operation of the individual one of the plurality of current control units; and
receive a second control signal for controlling the second mode of operation of the individual one of the plurality of current control units.

4. A driver circuit according to claim 3 further comprising a controller for supplying the first control signal to the individual one of the plurality of current control units and the second control signal to the individual one of the plurality of current control units.

5. A driver circuit according to claim 1 wherein an individual one of the plurality of current control units is further configured to receive a biasing signal for biasing the current source.

6. A driver circuit according to claim 1 wherein individual ones of the plurality of current control units are coupled in parallel to each other at the respective first and second nodes.

7. A driver circuit according to claim 6 wherein each of the plurality of current control units are independently operable in the first mode and second mode.

8. A driver circuit according to claim 1, wherein an individual one of the plurality of current control units comprises a first switch for controlling the first mode of operation; and a second switch for controlling the second mode of operation.

9. A driver circuit according to claim 8, wherein an on-state impedance of the first switch is equal to an on-state impedance of the second switch.

10. A driver circuit according to claim 8 wherein the impedance of the impedance unit is such that a voltage drop across the impedance unit, when current from the current source passes through, is equal to a forward voltage of the light source when the light source is turned on.

11. A driver circuit according to claim 1, wherein the light source is a laser diode.

12. The driver circuit according to claim 1, further comprising the light source, wherein the driver circuit is coupled to the light source for driving the light source.

13. A method for controlling a light source in a time-of-flight camera system using a driver circuit, the method comprising:
  operating a plurality of current control units in the driver circuit, in a first mode, to drive a current from a first potential to a second potential to turn on the light source, wherein the current is driven through the light source and through a first current path and a current source in the plurality of current control units;
  operating at least one of the plurality of current control units, in a second mode, to drive a current from the first potential to the second potential to turn off the light source, wherein the current is driven through a second current path and the current source in the plurality of current control units;
  operating at least one of the plurality of current control units, in a third mode of operation, to decouple the first potential from the second potential to inhibit current flow through the first current path and the second current path; and
  operating an impedance unit in the second current path to provide an impedance that is configured such that a voltage drop across the second current path during the second mode matches a combined voltage drop across the light source and the first current path during the first mode.

14. A method for controlling a light source in a time-of-flight camera system using a driver circuit, the method comprising:
  applying a pre-drive current to the light source by operating a first set of a plurality of current control units in the driver circuit in a first mode and operating a second set of the plurality of current control units in a second mode;
  applying a drive current to the light source by operating the first set of the plurality of current control units in the driver circuit in the first mode and operating the second set of the plurality of current control units in the first mode, wherein the drive current is a sum of the current generated by the first set and the second set of the plurality of current control units,
  wherein applying the pre-drive current is followed by switching to applying the drive current,
  wherein in the first mode, current is driven from a first potential to a second potential, wherein the current is driven through the light source and through a respective first current path and a respective current source in each of the plurality of current control units operating in the first mode,
  wherein in the second mode, current is driven from the first potential to the second potential, wherein the current is driven through a respective second current path and the respective current source in each of the plurality of current control units operating in the second mode;
  operating an impedance unit in the second current path to provide an impedance that is configured such that a voltage drop across the second current path during the second mode matches a combined voltage drop across the light source and the first current path during the first mode;
  selecting the first set of the plurality of current control units based on a desired pre-drive current, selecting the second set of the plurality of the current control units based on a desired drive current; and
  placing remaining ones of the plurality of current control units not in the first set or the second set in a third set, wherein each of the plurality of current control units in the third set is electrically decoupled from the light source.

15. The method for controlling a light source using a driver circuit according to claim 14, wherein a count of individual current control units operating in the first set is determined based on a desired value of the pre-drive current through the light source.

16. The method for controlling a light source using a driver circuit according to claim 14, wherein a count of individual current control units operating in the second set is determined based on a desired value of the pre-drive current and a desired value of the drive current.

17. The method for controlling a light source using a driver circuit according to claim 14, wherein each of the plurality of current control units share an impedance unit included in the driver circuit such that for the current control units that are operating in the second mode, shared current flows through the impedance unit and then branches to individual ones of the plurality of current control units.

18. The method for controlling a light source using a driver circuit according to claim 14, further comprising:
  controlling each of the plurality of current control units using a controller,
  wherein the controller uses independent control signals to set the pre-drive current and drive current that the driver circuit applies to the light source.

* * * * *